(12) United States Patent
Howell et al.

(10) Patent No.: US 9,521,769 B2
(45) Date of Patent: Dec. 13, 2016

(54) DUAL POSITION LATCH APPARATUS

(71) Applicant: Lenovo Enterprise Solutions (Singapore) Pte. Ltd., Singapore (SG)

(72) Inventors: Steven E. Howell, Oak Island, NC (US); Michael I. McGregor, Apex, NC (US); Camillo Sassano, Durham, NC (US); Jared E. Schott, Durham, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 202 days.

(21) Appl. No.: 14/459,531

(22) Filed: Aug. 14, 2014

(65) Prior Publication Data

US 2016/0050778 A1 Feb. 18, 2016

(51) Int. Cl.
*E05C 3/06* (2006.01)
*H05K 5/02* (2006.01)
*H05K 7/14* (2006.01)

(52) U.S. Cl.
CPC .......... *H05K 5/0221* (2013.01); *H05K 7/1488* (2013.01)

(58) Field of Classification Search
CPC ............. Y10T 292/1094; Y10T 292/1077; Y10T 292/092; Y10T 292/0861; Y10T 292/1033; Y10T 292/225; Y10T 292/0847; Y10T 292/1087; Y10T 292/237; Y10T 292/1099; Y10T 292/214; Y10T 29/49963; Y10T 70/5124
USPC ................ 292/215, 240, 197, 206, 212, 251
See application file for complete search history.

(56) References Cited

U.S. PATENT DOCUMENTS

| | | | |
|---|---|---|---|
| 6,171,120 B1 | 1/2001 | Bolich et al. | |
| 6,172,867 B1 | 1/2001 | Satou et al. | |
| 6,246,576 B1 | 6/2001 | Sands et al. | |
| 6,953,232 B2 | 10/2005 | Busby et al. | |
| 7,375,960 B2 | 5/2008 | Blaalid et al. | |
| 7,453,707 B2 | 11/2008 | Beall et al. | |

*Primary Examiner* — Mark Williams
(74) *Attorney, Agent, or Firm* — Katherine S. Brown; Jeffrey L. Streets

(57) ABSTRACT

A latch apparatus is provided with a dual action mechanism that can either pivot a cam hook from a first side of the apparatus for securing a sub-chassis into a chassis of laterally extend a component lock from a second side of the apparatus for securing a component within the sub-chassis. A single rotary actuator may be rotated in a first rotational direction to pivot the cam hook to an extended position and move the component lock to a retracted position, and rotated in a second rotational direction to pivot the cam hook to a retracted position and move the component lock to an extended position. The latch apparatus may include one or more of the dual action mechanisms actuated by the single actuator.

17 Claims, 6 Drawing Sheets

DUAL POSITION LATCH APPARATUS

BACKGROUND

Field of the Invention

The present invention relates to a latch apparatus for selectively securing one component within another component.

Background of the Related Art

In a datacenter, a server is often installed in a chassis that supplies shared I/O, power, and cooling to more than one server. Customized solutions may lead to various configurations of components being installed within the chassis. Some chassis may support a sub-chassis that, in turn, supports one or more server or other electronic component of a computer system. Such a sub-chassis must be secured within the larger chassis to ensure that power and data connectors are properly mated and that air plenums are maintained. Additionally, in order to overcome the mating force of these connections some type of mechanical advantage is typically required. The most common way this is achieved is through the use cam levers. These cam levers typically pivot about a fixed point on the sub-chassis and have a hook type features on one end that interacts with slotted features or attach points in the chassis to provide the install/removal motion. The other end of the cam lever is sufficiently longer than the hook type feature in order to provide a mechanical advantage. The components may also use cam levers so that the components are secured within the sub-chassis and connectors are properly mated to support operation of the components.

BRIEF SUMMARY

One embodiment of the present invention provides an apparatus comprising a sub-chassis slidably receivable within a chassis bay, the sub-chassis including a latch apparatus and a sub-chassis bay for slidably receiving a component. The latch apparatus comprises a rigid structure, actuator, coupling bracket, cam hook, component lock, and vertically extending pin. The rigid structure is secured along a proximal edge of the sub-chassis and the actuator has a fixed position relative to the rigid structure and rotatable about a longitudinal axis relative to the sub-chassis, wherein the actuator has an accessible head portion for manual rotation and a threaded portion. The coupling bracket threadably engages the threaded portion of the actuator and is constrained to longitudinal translational movement, the coupling bracket having a horizontal member with a lateral slot. The cam hook has a proximal end, a distal hook end and a central portion pivotally coupled to the rigid structure, wherein the cam hook is constrained to pivoting about a vertical axis between a retracted position and an extended position extending the distal hook end outward and forward relative to a first lateral side of the rigid structure to engage the chassis bay and secure the sub-chassis within the chassis bay. The component lock is coupled to the rigid structure and constrained to lateral translational movement between a retracted position and an extended position extending a lock arm from a second lateral side of the rigid structure to engage the component and secure the component within the sub-chassis bay, wherein the component lock has a longitudinal slot. The vertically extending pin is coupled with the proximal end of the cam hook, extends through the lateral slot in the horizontal member of the coupling bracket, and extends through the longitudinal slot in the component lock. Rotation of the actuator in a first rotational direction pivots the cam hook to the extended position and moves the component lock to the retracted position, and rotation of the actuator in a second rotational direction pivots the cam hook to the retracted position and moves the component lock to the extended position.

Another embodiment of the present invention provides a latch apparatus comprising a rigid structure, actuator, coupling bracket, cam hook, component lock and vertically extending pin. The rigid structure is securable along a proximal edge of a sub-chassis. The actuator has a fixed position relative to the rigid structure and rotatable about a longitudinal axis relative to the sub-chassis, wherein the actuator has an accessible head portion for manual rotation and a threaded portion. The coupling bracket threadably engages the threaded portion of the actuator and is constrained to longitudinal translational movement, the coupling bracket having a horizontal member with a lateral slot. The cam hook has a proximal end, a distal hook end and a central portion pivotally coupled to the rigid structure, wherein the cam hook is constrained to pivoting about a vertical axis between a retracted position and an extended position extending the distal hook end outward and forward relative to a first lateral side of the rigid structure. The component lock is coupled to the rigid structure and is constrained to lateral translational movement between a retracted position and an extended position extending a lock arm from a second lateral side of the rigid structure, the component lock having a longitudinal slot. The vertically extending pin is coupled with the proximal end of the cam hook, extends through the lateral slot in the horizontal member of the coupling bracket, and extends through the longitudinal slot in the component lock. Rotation of the actuator in a first rotational direction pivots the cam hook to the extended position and moves the component lock to the retracted position, and rotation of the actuator in a second rotational direction pivots the cam hook to the retracted position and moves the component lock to the extended position.

Yet another embodiment of the present invention provides a method comprising: slidably receiving an electronic component into a sub-chassis, wherein the sub-chassis includes a latch apparatus; securing the electronic component within the sub-chassis by rotating an actuator of the latch apparatus in a first rotational direction to simultaneously cause a component lock to translate laterally from a retracted position to an extended position extending a lock arm from a second lateral side of the latch apparatus and cause a cam hook to pivot about a vertical axis from an extended position to a retracted position retracting a distal hook end within a first lateral side of the latch apparatus; with the component secured within the sub-chassis, slidably receiving the sub-chassis into a chassis; and securing the sub-chassis within the chassis by rotating the actuator of the latch apparatus in a second rotational direction to simultaneously cause the component lock to translate laterally from the extended position to the retracted position retracting the lock arm from the second lateral side of the latch apparatus and cause the cam hook to pivot about the vertical axis from the retracted position to the extended position extending the distal hook end outward and forward relative to the first lateral side of the latch apparatus.

DETAILED DESCRIPTION

Figure 1A:
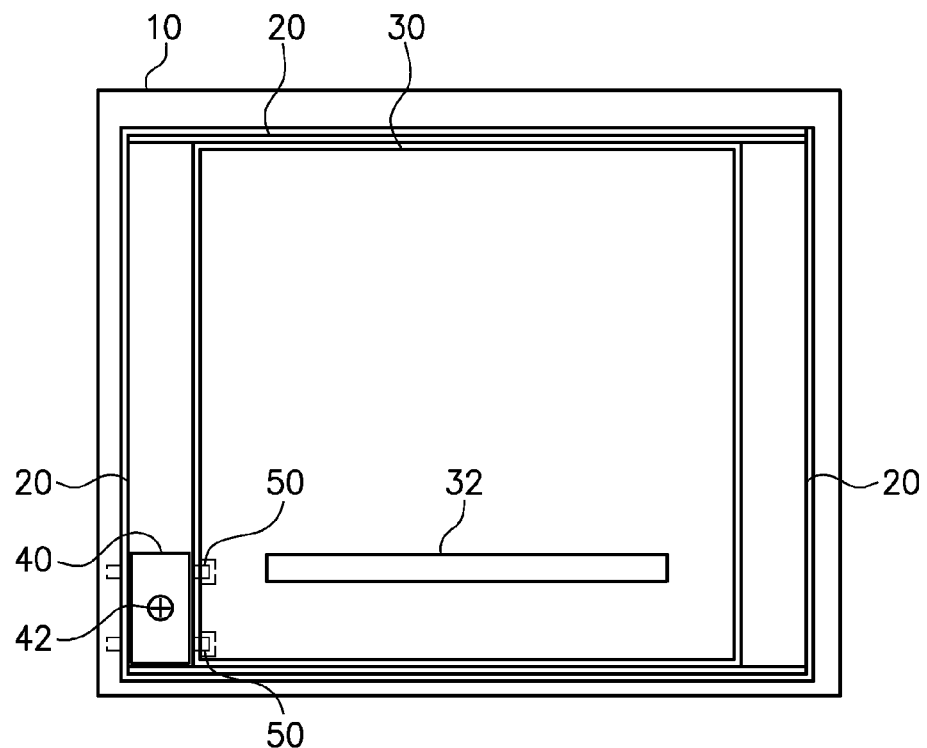
FIG. 1A is a front view of a sub-chassis received within a chassis and locking a drawer within the sub-chassis.

One embodiment of the present invention provides an apparatus comprising a sub-chassis slidably receivable within a chassis bay, the sub-chassis including a latch apparatus and a sub-chassis bay for slidably receiving a component. The latch apparatus comprises a rigid structure, actuator, coupling bracket, cam hook, component lock, and vertically extending pin. The rigid structure is secured along a proximal edge of the sub-chassis and the actuator has a fixed position relative to the rigid structure and rotatable about a longitudinal axis relative to the sub-chassis, wherein the actuator has an accessible head portion for manual rotation and a threaded portion. The coupling bracket threadably engages the threaded portion of the actuator and is constrained to longitudinal translational movement, the coupling bracket having a horizontal member with a lateral slot. The cam hook has a proximal end, a distal hook end and a central portion pivotally coupled to the rigid structure, wherein the cam hook is constrained to pivoting about a vertical axis between a retracted position and an extended position extending the distal hook end outward and forward relative to a first lateral side of the rigid structure to engage the chassis bay and secure the sub-chassis within the chassis bay. The component lock is coupled to the rigid structure and constrained to lateral translational movement between a retracted position and an extended position extending a lock arm from a second lateral side of the rigid structure to engage the component and secure the component within the sub-chassis bay, wherein the component lock has a longitudinal slot. The vertically extending pin is coupled with the proximal end of the cam hook, extends through the lateral slot in the horizontal member of the coupling bracket, and extends through the longitudinal slot in the component lock. Rotation of the actuator in a first rotational direction pivots the cam hook to the extended position and moves the component lock to the retracted position, and rotation of the actuator in a second rotational direction pivots the cam hook to the retracted position and moves the component lock to the extended position.

In one option, the coupling bracket includes a second horizontal member with a lateral slot, and the latch apparatus further includes a second cam hook, second component lock, and second vertically extending pin. The second cam hook has a proximal end, a distal hook end and a central portion pivotally coupled to the rigid structure, wherein the second cam hook is constrained to pivoting about a vertical axis between a retracted position and an extended position extending the distal hook end outward and forward relative to the first lateral side of the rigid structure to engage the chassis bay and secure the sub-chassis within the chassis bay. The second component lock is coupled to the rigid structure and constrained to lateral translational movement between a retracted position and an extended position extending a lock arm of the second component lock from the second lateral side of the rigid structure to engage the component and secure the component within the sub-chassis bay, wherein the second component lock has a longitudinal slot. The second vertically extending pin is coupled with the proximal end of the second cam hook, extends through the lateral slot in the second horizontal member of the coupling bracket, and extends through the longitudinal slot in the second component lock. Rotation of the actuator in a first rotational direction pivots the second cam hook to the extended position and moves the second component lock to the retracted position, and rotation of the actuator in a second rotational direction pivots the second cam hook to the retracted position and moves the second component lock to the extended position. The first and second horizontal members are preferably on opposites sides of the coupling bracket with the actuator between the first and second horizontal members.

Another embodiment of the present invention provides a latch apparatus comprising a rigid structure, actuator, coupling bracket, cam hook, component lock and vertically extending pin. The rigid structure is securable along a proximal edge of a sub-chassis. The actuator has a fixed position relative to the rigid structure and rotatable about a longitudinal axis relative to the sub-chassis, wherein the actuator has an accessible head portion for manual rotation and a threaded portion. The coupling bracket threadably engages the threaded portion of the actuator and is constrained to longitudinal translational movement, the coupling bracket having a horizontal member with a lateral slot. The cam hook has a proximal end, a distal hook end and a central portion pivotally coupled to the rigid structure, wherein the cam hook is constrained to pivoting about a vertical axis between a retracted position and an extended position extending the distal hook end outward and forward relative to a first lateral side of the rigid structure. The component lock is coupled to the rigid structure and is constrained to lateral translational movement between a retracted position and an extended position extending a lock arm from a second lateral side of the rigid structure, the component lock having a longitudinal slot. The vertically extending pin is coupled with the proximal end of the cam hook, extends through the lateral slot in the horizontal member of the coupling bracket, and extends through the longitudinal slot in the component lock. Rotation of the actuator in a first rotational direction pivots the cam hook to the extended position and moves the component lock to the retracted position, and rotation of the actuator in a second rotational direction pivots the cam hook to the retracted position and moves the component lock to the extended position.

Yet another embodiment of the present invention provides a method comprising: slidably receiving an electronic component into a sub-chassis, wherein the sub-chassis includes a latch apparatus; securing the electronic component within the sub-chassis by rotating an actuator of the latch apparatus in a first rotational direction to simultaneously cause a component lock to translate laterally from a retracted position to an extended position extending a lock arm from a second lateral side of the latch apparatus and cause a cam hook to pivot about a vertical axis from an extended position to a retracted position retracting a distal hook end within a first lateral side of the latch apparatus; with the component secured within the sub-chassis, slidably receiving the sub-chassis into a chassis; and securing the sub-chassis within the chassis by rotating the actuator of the latch apparatus in a second rotational direction to simultaneously cause the component lock to translate laterally from the extended position to the retracted position retracting the lock arm from the second lateral side of the latch apparatus and cause the cam hook to pivot about the vertical axis from the retracted position to the extended position extending the distal hook end outward and forward relative to the first lateral side of the latch apparatus.

Figure 1B:
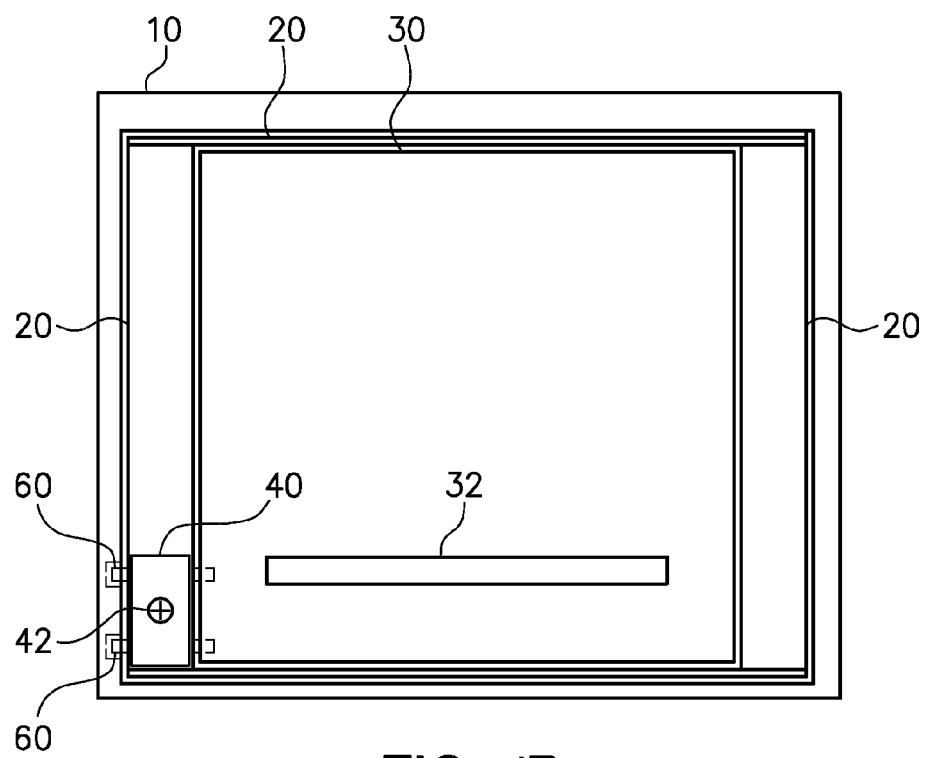
FIG. 1B is a front view of a sub-chassis locked within the chassis.

FIG. 1A is a front view of a sub-chassis 30 received within a chassis 10 and locking a component 30 within the sub-chassis 20. The sub-chassis 20 includes a latch apparatus 40 that is secured to a lower proximal corner of the sub-chassis. The latch apparatus includes an accessible rotary actuator 42, rather than a cam lever, that may be rotated in a first rotational direction to secure the sub-chassis 20 within the chassis 10 (as shown in FIG. 1B) or rotated in a second rotational direction to secure the component 30 within the sub-chassis 20 (as shown in FIG. 1A). The latch apparatus is designed so that the sub-chassis 20 is secured either to the chassis 10 or the component 30, but is not secured to both the chassis 10 and the component 30 at the same time. The component 30 may, for example, include one or more servers, or be a drawer containing multiple electronic devices.

As shown, the component 30 includes a handle 32 to facilitate manual positioning of the component. However, when the component 30 is locked into the sub-chassis 20 (as shown in FIG. 1A) by extension of the component locks 50, the handle 32 may also facilitate manual positioning of both the component 30 and the attached sub-chassis 20, such as positioning the sub-chassis and component into a bay of the chassis 10.

FIG. 1B is a front view of the sub-chassis 20 after it has been locked within the chassis 10. The sub-chassis 20 is locked within the chassis 10 using two cam hooks 60 that engage two attach points or inward facing slots in the side of the chassis 10. The latch apparatus 40 is operated by rotating the rotary actuator 42 to simultaneously extend both of the cam hooks 60 and retract both of the component locks 50. As shown in FIG. 1B, the component includes a drawer that is unlocked and may be removed from the chassis while the sub-chassis remains locked in the chassis.

The cam hooks 60 are preferably designed to convey a mating force from the actuator to the chassis in order to complete a blind mate connection between the chassis and sub-chassis. Preferably, the sub-chassis is manually positioned and pushed a majority of the way into the chassis and then the cam hooks are actuated to perform the final seating of electronic connectors between the sub-chassis and the chassis. For this purpose, the cam hooks may have a geometry that is similar to cam hooks that may be currently used on the cam levers of other sub-chassis. Furthermore, the latch apparatus may be configured with the cam hooks in a position to engage the same attach points.

However, if the sub-chassis 20 is to be removed from the chassis 10, the actuator 42 is rotated in an opposite direction to unlock the sub-chassis from the chassis at the same time that the component 30 is being locked in the sub-chassis. Locking the component within the sub-chassis allows extraction of the sub-chassis by means of pulling on the drawer handle 32, where otherwise the sub-chassis 20 would remain in the chassis.

Figure 2A:
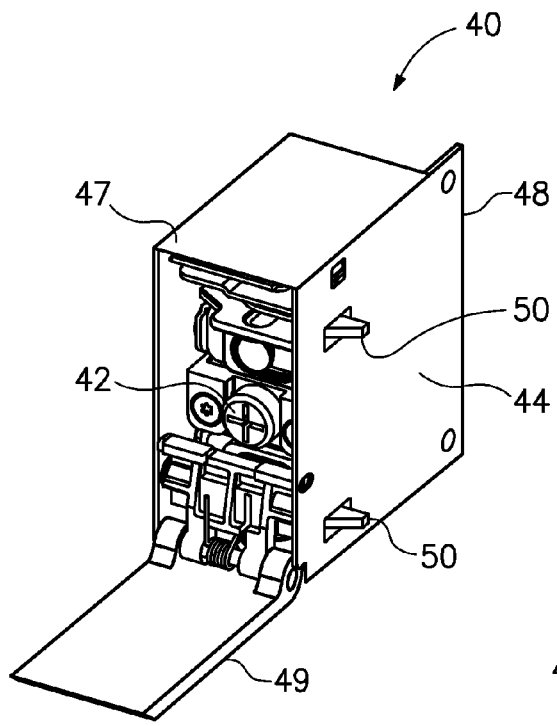
FIG. 2A is a perspective view of a sub-chassis latch having its drawer locks extending from a first lateral side of the latch apparatus.

FIG. 2A is a perspective view of a latch apparatus 40 having its component locks 50 extending from a first lateral side 44 of the latch apparatus. This extended position of the component locks 50 is consistent with FIG. 1A where the component 30 is secured in the sub-chassis 20. A flange 48 may be used to attach the latch apparatus 40 to the sub-chassis 20. In the implementation shown, the latch apparatus 40 includes an access door 49 hinged to the rigid structure 47 to selectively cover and access the head portion of the actuator 42. The accessible head portion includes a recess configured to receive a screwdriver, hex key, or other tool.

Figure 2B:
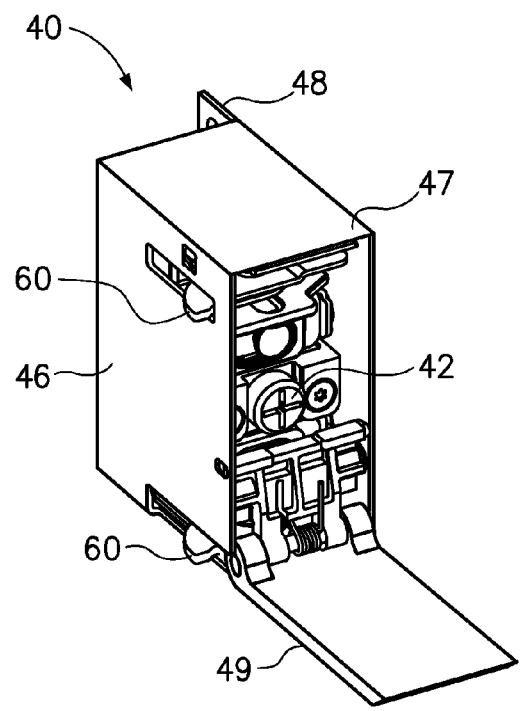
FIG. 2B is a perspective view of a sub-chassis latch having its cam hooks extending from a second lateral side of the latch apparatus.

FIG. 2B is a perspective view of the latch apparatus 40 having its cam hooks 60 extending from a second lateral side 46 of the latch apparatus. This extended position of the cam hooks 60 is consistent with FIG. 1B where the sub-chassis 20 is secured in the chassis 10.

Figure 3A:
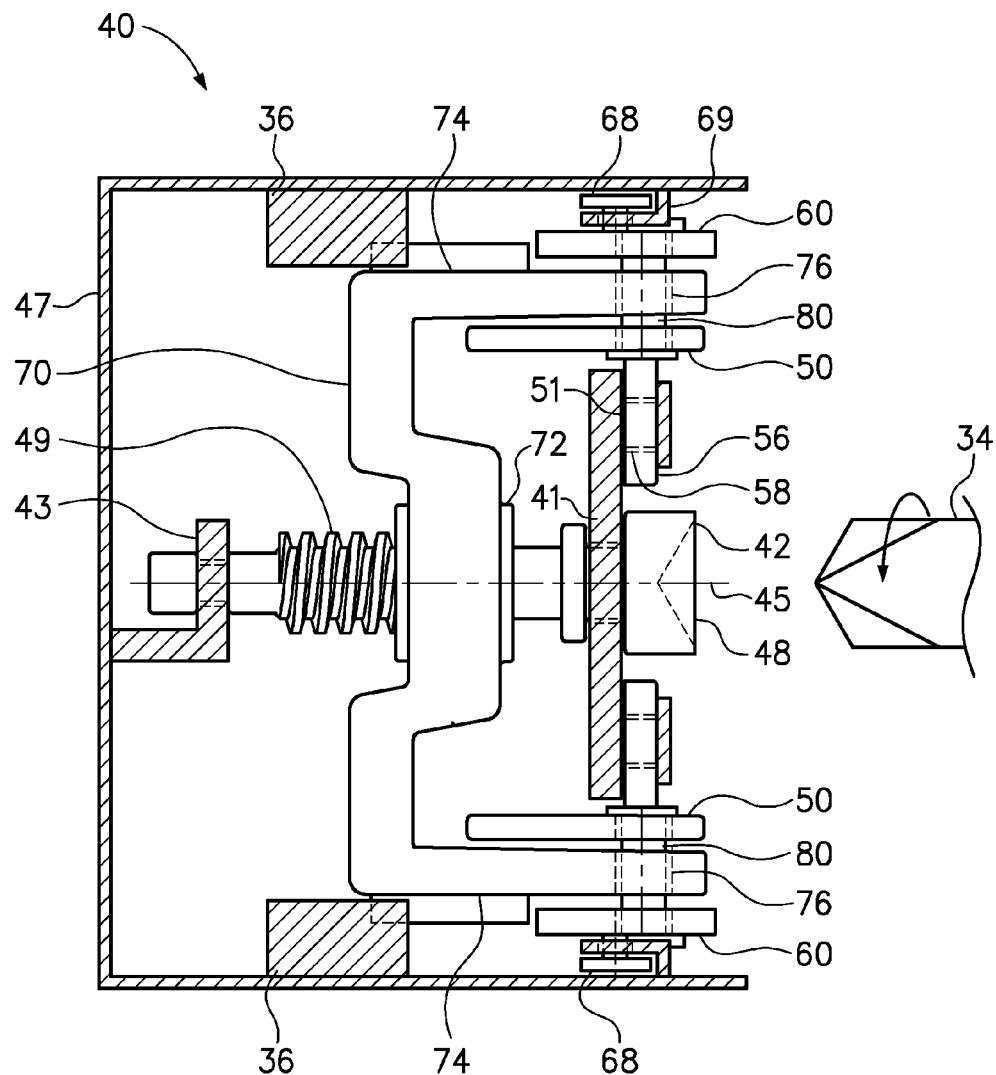
FIG. 3A is a schematic side view of the sub-chassis latch apparatus in a first position consistent with the drawer locks being extended.

FIG. 3A is a schematic side view of the sub-chassis latch apparatus 40 in a first position consistent with the drawer locks 50 being extended to secure a component within the sub-chassis (see also FIGS. 1A and 2A). The latch apparatus 40 comprises a rigid structure 47 (shown in cross-hatching for emphasis), an actuator 42, a coupling bracket 70, two cam hooks 60, two component locks 50, and two vertically extending pins 80.

The rigid structure 47 is preferably secured along a proximal front edge of the sub-chassis as shown in FIGS. 1A and 1B. The rigid structure is shown including a housing with an open front, but the rigid structure may take many forms. Most importantly, the rigid structure must support certain elements of the latch apparatus, such allowing the actuator to rotate in a fixed position, securing fixed pivot points for the cam hooks, constraining the component locks to lateral translational movement. Accordingly, the rigid structure may include internal structure extending among the elements as needed. Where internal structure is shown without any illustrated connection to the rest of the rigid structure, it should be understood that such connection is present in one manner or another. Where the rigid structure includes a housing, the rigid structure may include structural elements extending between two or more sides of the housing.

The actuator 42 is fixed in position relative to the rigid structure by a first bushing 41 near a first end of the actuator and a second bushing 43 near a second end of the actuator. Therefore, the actuator 47 is rotatable about a longitudinal axis 45 relative to the sub-chassis, wherein the actuator has an accessible head portion 48 for manual rotation and a threaded portion. For example, the head portion 48 may include a feature for engaging a tool 34, such as a screwdriver or a hex key. Rotation of the head portion 48 causes the entire actuator 47 to rotate, including an externally threaded portion 49. The longitudinal axis 45 of the actuator 47 is preferably parallel to an insertion direction for inserting the sub-chassis 20 into the chassis 10 (See FIG. 1A).

The coupling bracket 70 includes an internally threaded portion 72 that threadably engages the threaded portion 49 of the actuator 47. Rotation of the actuator causes the coupling bracket to move in a proximal direction (to the right in FIG. 3A) or a distal direction (to the left in FIG. 3A). As shown, the rigid structure 47 includes a pair of plates 36 that prevent the coupling bracket 70 from rotating. Accordingly, the coupling bracket 70 is constrained to longitudinal translational movement (left and right as shown in FIG. 3A). The coupling bracket 70 also includes upper and lower horizontal members 74, each having a lateral slot 76 (in and out of the image in FIG. 3A).

The function of the lateral slot 76 will be described in detail below. However, it should be understood that the illustrated embodiment of the latch apparatus 40 includes duplicate mechanisms that may work in the same manner, although the mechanisms are minor-images of each other. One mechanism involves the upper horizontal member 74 of the coupling bracket 70 and the other mechanism involves the lower horizontal member 74 of the coupling bracket 70. In the description that follows, the elements of the mechanism may be discussed in terms of the upper mechanism, but it should be understood that the description is equally applicable to the lower mechanism. In embodiments where the latch apparatus 40 has both first and second horizontal members, the first and second horizontal members are preferably on opposites sides of the coupling bracket with the actuator between the first and second horizontal members. This configuration provides the benefit of balancing forces between the actuator and the cam hooks, which forces could otherwise lead to binding between elements of the mechanism.

Figure 4:
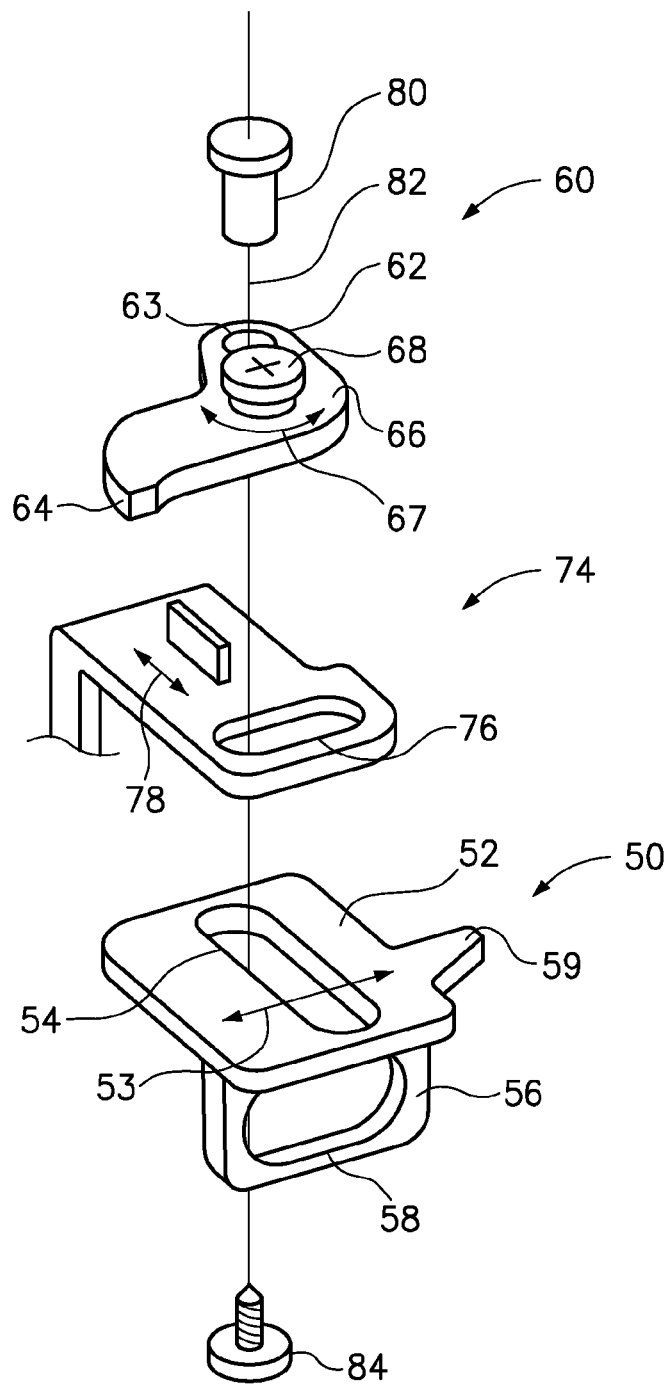
FIG. 4 is an exploded perspective view of a first latch mechanism including one cam hook and one drawer lock.

FIG. 4 is an exploded perspective view of a first (upper) latch mechanism including one cam hook 60 and one component lock 50 that interact with the horizontal member 74 of the coupling bracket via the vertically extending pin 80. The cam hook 60 has a proximal end 62 including a hole 63, a distal hook end 64 and a central portion 66 including a pivot pin 68 pivotally coupled to the rigid structure. Referring briefly to FIG. 3A, the pivot pin 68 is shown pivotally secured to a bracket 69 that is attached to the top of the rigid structure 47. Accordingly, the cam hook 60 is constrained to pivoting (see double headed arrow 67) about a vertical axis defined by the pivot pin 68 between a retracted position and an extended position extending the distal hook end 64 outward and forward relative to a first lateral side 46 (see FIG. 2B) of the rigid structure.

FIG. 4 also shows the component lock 50 including a horizontal member 52 with a longitudinal slot 54, a vertical member 56 with a lateral slot 58, and a lock arm 59. Referring briefly to FIG. 3A, the lateral slot 58 in the vertical member 56 of the component lock 50 receives a pin 51 that is attached to an internal member (see hashed lines) of the rigid structure 47. Accordingly, the component lock 50 is constrained to lateral translational movement (see double headed arrow 53) between a retracted position and an extended position extending the lock arm 59 from a second lateral side 44 (see FIG. 2A) of the rigid structure.

FIG. 4 further shows a horizontal member 74 of the coupling bracket including a lateral slot 76. As discussed in reference to FIG. 3A, the coupling bracket 70 and the horizontal member 74 are constrained to translational longitudinal movement (see double headed arrow 78).

The vertically extending pin 80 extends through the hole 63 in the proximal end 62 of the cam hook 60, through the lateral slot 76 in the horizontal member 74 of the coupling bracket, and through the longitudinal slot 54 in the component lock 50. Accordingly, the shaft of the vertically extending pin 80 extends along the route illustrated by line 82 and has a second pin head 84 secured to the opposing end. Although the cam hook 60, the horizontal member 74, and the component lock 50 are shown in an exploded view in FIG. 4 and are illustrated with gaps there between in FIG. 3A, these members may be in loose surface-to-surface contact with the adjacent members.

Referring briefly to FIG. 3A, the actuator 42 has been turned in a first direction (counter-clockwise as viewed from the front of the latch apparatus as in FIG. 1A) such that the coupling bracket 70 is in its proximal position. In this position, the cam hooks 60 are in the retracted position and the component locks 50 are in the extended position.

Figure 3B:
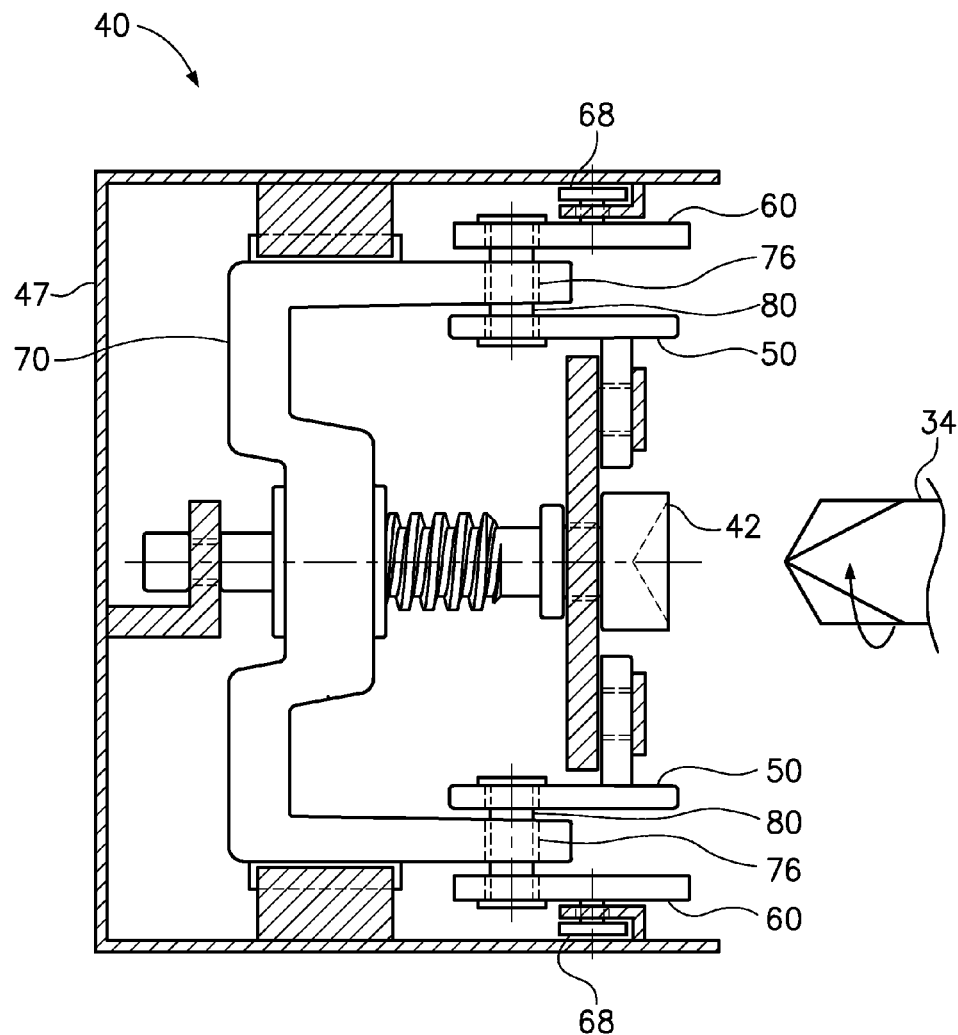
FIG. 3B is a schematic side view of the sub-chassis latch in a second position consistent with the cam hooks being extended.

FIG. 3B is a schematic side view of the latch apparatus 40 in a second position consistent with the cam hooks 60 being extended and the component latch being retracted 50. To reach this position, the actuator 42 has been turned in a second direction (clockwise as viewed from the front of the latch apparatus as in FIG. 1B) such that the coupling bracket 70 is in its distal position.

Figures 5A, 5B:
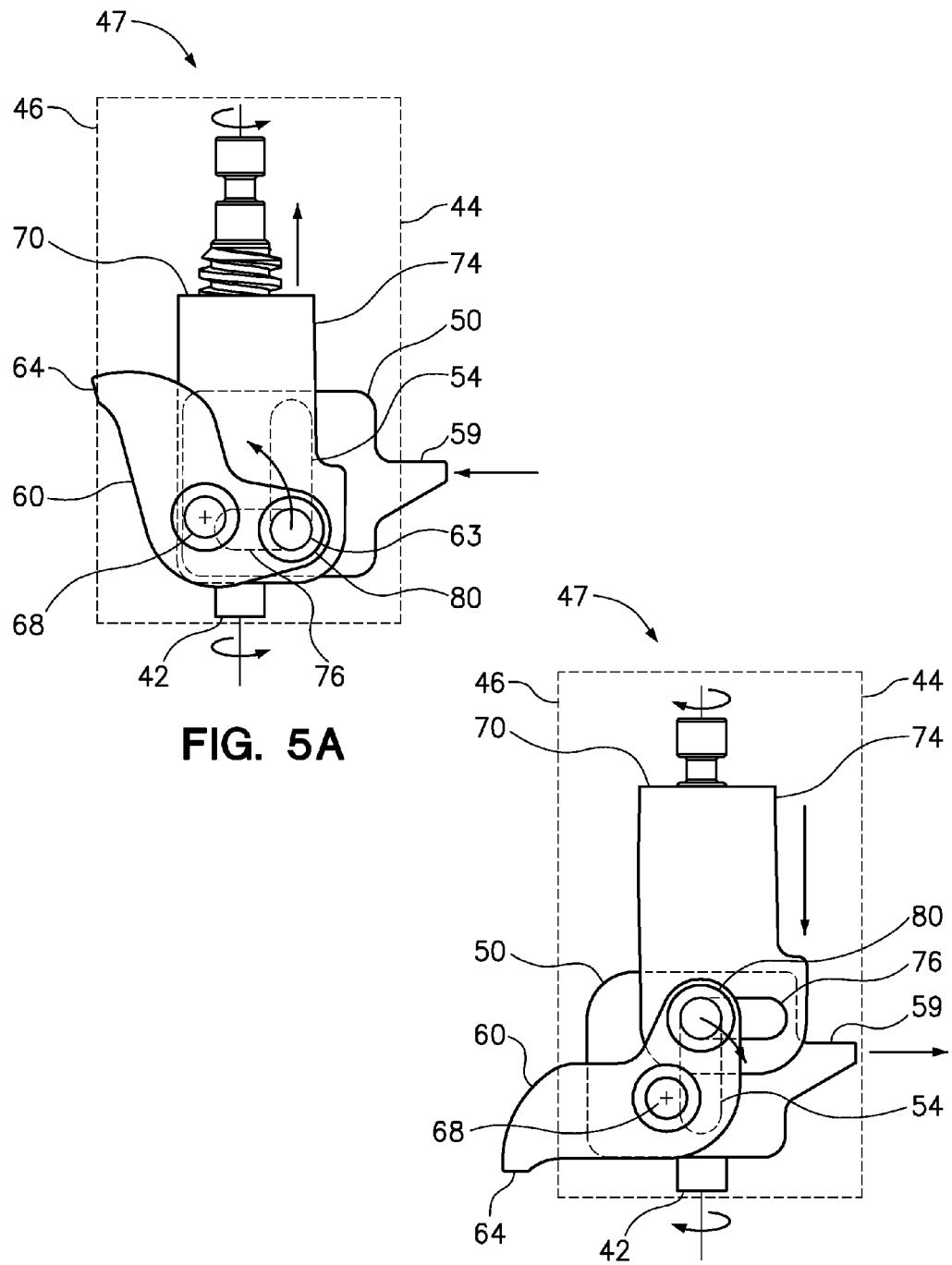
FIG. 5A is a schematic top view of the latch mechanism of FIG. 4 in a first position with the drawer lock extended.
FIG. 5B is a schematic top view of the latch mechanism of FIG. 4 in a second position with the cam hook extended.

FIG. 5A is a schematic top view of the latch mechanism of FIG. 4 in a first position with the drawer lock 50 extended out of the rigid structure 47 for securing a component. Note that the vertically extending pin 80 extends through the hole 63 in the cam hook 60, the lateral slot 76 in the horizontal member 74 of the coupling bracket 70, and the longitudinal slot 54 in the component lock 50. Since the cam hook 60 is constrained to pivoting about a vertical axis defined by the pivot pin 68, the component lock 50 is constrained to translational lateral movement, and the horizontal member 74 of the coupling bracket is constrained to translational longitudinal movement, these three elements (cam hook, component lock and horizontal member) can only move in a coordinated manner. With the horizontal member 74 moved to the proximal position shown in FIG. 5A, the pivot pin 80 applies a longitudinal force on the proximal end of the cam hook 60 causing the cam hook to pivot to a retracted position. As the cam hook pivots in this manner, the pivot pin 80 is pushed through an arcuate path that applies a lateral (extending) force to the component lock 50.

FIG. 5B is a schematic top view of the latch mechanism as shown in FIG. 5A, but in a second position with the cam hook 60 extended and the component lock 50 retracted. As described above, the cam hook 60, component lock 50 and horizontal member 74 can only move in a coordinated manner. Accordingly, when the actuator 42 is rotated to translate the coupling bracket 70 in a distal longitudinal direction, the horizontal member 74 moves toward a distal position as shown in FIG. 5B. As the horizontal member 74 moves distally, the pivot pin 80 is drawn distally and applies a rearward longitudinal force on the proximal end of the cam hook 60 causing the cam hook to pivot to an extended position. As the cam hook pivots in this manner, the pivot pin 80 is pulled through an arcuate path that applies a lateral (retracting) force to the component lock 50. In reference to both FIG. 5A and FIG. 5B, it has been illustrated that the interaction between the cam hook 60 and the component lock 50 only allows one of the two elements to be in an extended position.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:
   a sub-chassis slidably receivable within a chassis bay, the sub-chassis including a sub-chassis bay for slidably receiving a component, and the sub-chassis further including a latch apparatus;
   the latch apparatus comprising:
      a rigid structure secured along a proximal edge of the sub-chassis;
      an actuator having a fixed position relative to the rigid structure and rotatable about a longitudinal axis relative to the sub-chassis, wherein the actuator has an accessible head portion for manual rotation and a threaded portion;
      a coupling bracket threadably engaging the threaded portion of the actuator and constrained to longitudinal translational movement, the coupling bracket having a horizontal member with a lateral slot;
      a cam hook having a proximal end, a distal hook end and a central portion pivotally coupled to the rigid structure, wherein the cam hook is constrained to pivoting about a vertical axis between a retracted position and an extended position extending the distal hook end outward and forward relative to a first lateral side of the rigid structure to engage the chassis bay and secure the sub-chassis within the chassis bay;
      a component lock coupled to the rigid structure and constrained to lateral translational movement between a retracted position and an extended position extending a lock arm from a second lateral side of the rigid structure to engage the component and secure the component within the sub-chassis bay, the component lock having a longitudinal slot; and
      a vertically extending pin coupled with the proximal end of the cam hook, extending through the lateral slot in the horizontal member of the coupling bracket, and extending through the longitudinal slot in the component lock;
      wherein rotation of the actuator in a first rotational direction pivots the cam hook to the extended position and moves the component lock to the retracted position, and wherein rotation of the actuator in a second rotational direction pivots the cam hook to the retracted position and moves the component lock to the extended position.

2. The apparatus of claim 1, wherein rotation of the actuator in the first rotational direction causes the coupling bracket to translate in a distal longitudinal direction, and wherein rotation of the actuator in the second rotational direction causes the coupling bracket to translate in a proximal longitudinal direction.

3. The apparatus of claim 1, wherein the longitudinal axis of the actuator is parallel to an insertion direction for inserting the sub-chassis into the chassis bay.

4. The apparatus of claim 1, wherein the coupling bracket includes a second horizontal member with a lateral slot, the latch apparatus further comprising:
   a second cam hook having a proximal end, a distal hook end and a central portion pivotally coupled to the rigid structure, wherein the second cam hook is constrained to pivoting about a vertical axis between a retracted position and an extended position extending the distal hook end outward and forward relative to the first lateral side of the rigid structure to engage the chassis bay and secure the sub-chassis within the chassis bay;
   a second component lock coupled to the rigid structure and constrained to lateral translational movement between a retracted position and an extended position extending a lock arm of the second component lock from the second lateral side of the rigid structure to engage the component and secure the component within the sub-chassis bay, the second component lock having a longitudinal slot; and
   a second vertically extending pin coupled with the proximal end of the second cam hook, extending through the lateral slot in the second horizontal member of the coupling bracket, and extending through the longitudinal slot in the second component lock;
   wherein rotation of the actuator in a first rotational direction pivots the second cam hook to the extended position and moves the second component lock to the retracted position, and wherein rotation of the actuator in a second rotational direction pivots the second cam hook to the retracted position and moves the second component lock to the extended position.

5. The apparatus of claim 4, wherein the first and second horizontal members are on opposites sides of the coupling bracket with the actuator between the first and second horizontal members.

6. The apparatus of claim 1, further comprising:
   an access door hinged to the rigid structure to selectively cover and access the head portion of the actuator.

7. The apparatus of claim 1, wherein the latch apparatus is secured to a lower proximal corner of the sub-chassis.

8. The apparatus of claim 1, wherein the cam hooks convey a mating force from the actuator to the chassis in order to complete a connection between the chassis and sub-chassis.

9. The apparatus of claim 1, wherein the component includes one or more servers.

10. The apparatus of claim 1, wherein the component is a drawer containing multiple electronic devices.

11. The apparatus of claim 1, wherein the accessible head portion includes a recess configured to receive a screwdriver.

12. The apparatus of claim 1, the latch apparatus further comprising:
   first and second bushings secured to the rigid structure and rotatably securing the actuator.

13. A latch apparatus comprising:
   a rigid structure securable along a proximal edge of a sub-chassis;
   an actuator having a fixed position relative to the rigid structure and rotatable about a longitudinal axis relative to the sub-chassis, wherein the actuator has an accessible head portion for manual rotation and a threaded portion;
   a coupling bracket threadably engaging the threaded portion of the actuator and constrained to longitudinal translational movement, the coupling bracket having a horizontal member with a lateral slot;

a cam hook having a proximal end, a distal hook end and a central portion pivotally coupled to the rigid structure, wherein the cam hook is constrained to pivoting about a vertical axis between a retracted position and an extended position extending the distal hook end outward and forward relative to a first lateral side of the rigid structure;

a component lock coupled to the rigid structure and constrained to lateral translational movement between a retracted position and an extended position extending a lock arm from a second lateral side of the rigid structure, the component lock having a longitudinal slot; and a vertically extending pin coupled with the proximal end of the cam hook, extending through the lateral slot in the horizontal member of the coupling bracket, and extending through the longitudinal slot in the component lock;

wherein rotation of the actuator in a first rotational direction pivots the cam hook to the extended position and moves the component lock to the retracted position, and wherein rotation of the actuator in a second rotational direction pivots the cam hook to the retracted position and moves the component lock to the extended position.

14. The latch apparatus of claim 13, wherein rotation of the actuator in the first rotational direction causes the coupling bracket to translate in a distal longitudinal direction, and wherein rotation of the actuator in the second rotational causes the coupling bracket to translate in a proximal longitudinal direction.

15. The latch apparatus of claim 13, wherein the coupling bracket includes a second horizontal member with a lateral slot, the latch apparatus further comprising:

a second cam hook having a proximal end, a distal hook end and a central portion pivotally coupled to the rigid structure, wherein the second cam hook is constrained to pivoting about a vertical axis between a retracted position and an extended position extending the distal hook end outward and forward relative to the first lateral side of the rigid structure;

a second component lock coupled to the rigid structure and constrained to lateral translational movement between a retracted position and an extended position extending a lock arm of the second component lock from the second lateral side of the rigid structure, the second component lock having a longitudinal slot; and a second vertically extending pin coupled with the proximal end of the second cam hook, extending through the lateral slot in the second horizontal member of the coupling bracket, and extending through the longitudinal slot in the second component lock;

wherein rotation of the actuator in a first rotational direction pivots the second cam hook to the extended position and moves the second component lock to the retracted position, and wherein rotation of the actuator in a second rotational direction pivots the second cam hook to the retracted position and moves the second component lock to the extended position.

16. The latch apparatus of claim 15, wherein the first and second horizontal members are on opposites sides of the coupling bracket with the actuator between the first and second horizontal members.

17. The latch apparatus of claim 13, wherein the accessible head portion includes a recess configured to receive a screwdriver.

* * * * *